(12) United States Patent
Pickerd et al.

(10) Patent No.: US 6,895,349 B2
(45) Date of Patent: May 17, 2005

(54) GATE COMPARATOR

(75) Inventors: John J. Pickerd, Hillsboro, OR (US); Paul H. Buckle, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 354 days.

(21) Appl. No.: 10/008,938

(22) Filed: Nov. 8, 2001

(65) Prior Publication Data

US 2002/0062199 A1 May 23, 2002

Related U.S. Application Data

(60) Provisional application No. 60/247,297, filed on Nov. 9, 2000.

(51) Int. Cl.[7] .............................................. G06F 19/00
(52) U.S. Cl. ............................ 702/71; 702/66; 702/71; 702/183; 702/120; 714/6; 714/16; 714/57; 714/701; 340/3.42; 340/292; 345/616; 345/813; 324/512; 324/521; 324/528
(58) Field of Search ........................ 702/66–71, 75–76, 702/123–126, 120, 121, 183, 189, FOR 103, 107, 108, 110, 134, 170, 171, 79, 117; 714/6, 16, 701, 616, 703–706, 723, 732, 746, 758, 38, 45–49; 340/3.42, 292, 3.43, 3.44; 324/521, 528, 512, 555; 345/616, 813

(56) References Cited

U.S. PATENT DOCUMENTS

| | | | | |
|---|---|---|---|---|
| 3,810,027 A | * | 5/1974 | Cook et al. .................. | 328/129 |
| 4,005,477 A | * | 1/1977 | Ottesen ......................... | 360/51 |
| 5,371,851 A | * | 12/1994 | Pieper et al. ................ | 395/164 |
| 5,530,454 A | | 6/1996 | Etheridge et al. | |
| 5,999,163 A | | 12/1999 | Ivers et al. | |
| 6,009,523 A | * | 12/1999 | Owaki et al. ................ | 713/200 |
| 6,215,697 B1 | * | 4/2001 | Lu et al. .................. | 365/185.03 |

FOREIGN PATENT DOCUMENTS

EP      089079      4/2001

OTHER PUBLICATIONS

Singer et al., Technology Advances in VLF/LF Atmospheric Noise Generation and Characterization for Laboratory Use, May 10–12, 1994, IEEE, vol.: 1880, pp. 499–501.*

* cited by examiner

*Primary Examiner*—Marc S. Hoff
*Assistant Examiner*—Elias Desta
(74) *Attorney, Agent, or Firm*—Thomas F. Lenihan; Francis I. Gray

(57) ABSTRACT

A gate comparator control panel, in accordance with the subject invention, allows a user to define up to four different gate regions that may exist on any of the live waveforms, maths waveforms, or REF waveforms. A menu for each gate controls the position of each gate and selects the source for the signal that is to be gated. All gates must be the same width. A high level application copies the gated region of a waveform into a REF memory. For example, Gate 1 would go into REF 1, gate 2 into REF2 and so on. A user-settable tolerance value is used to determine if difference between the waveforms of the gates reaches a point at which a violation is indicated. A master gate position control causes all gates to move by the same amount, thus maintaining a constant distance between them. A master gate width control causes all gates to change width. Run, pause, and stop menu items are used to control how the gates automatically scan though the waveforms to which they are attached while maintaining constant spacing between them. A comparison is performed on a point-by-point basis between the signals of the gates.

13 Claims, 5 Drawing Sheets

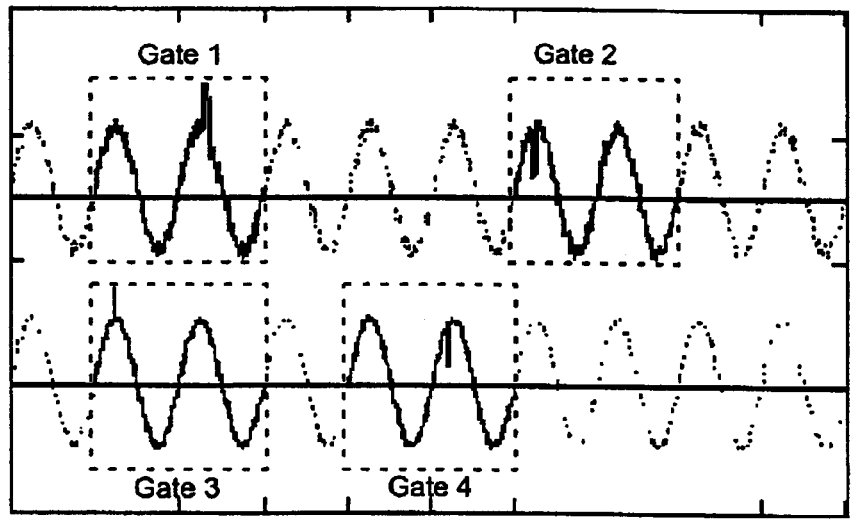
Fig. 3
Fig. 4A
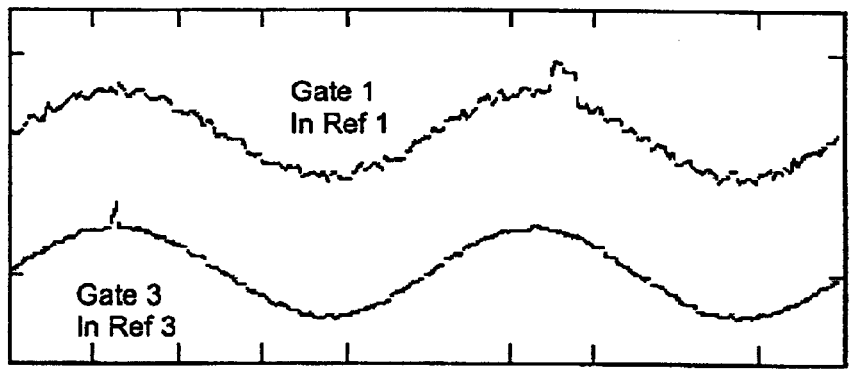
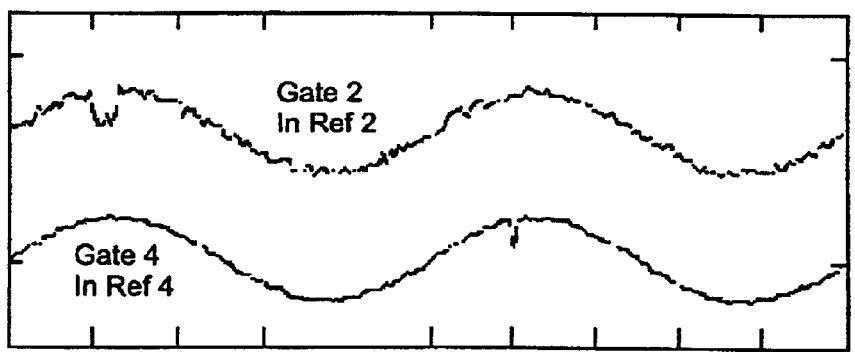
Fig. 4B

GATE COMPARATOR

This application claims the benefit of Provisional Application No. 60/247,297, filed Nov. 9, 2000.

FIELD OF THE INVENTION

The invention generally concerns test and measurement equipment, and specifically concerns processing of long record length data acquisitions in an oscilloscope or the like.

BACKGROUND OF THE INVENTION

Oscilloscopes capable of acquiring long record length acquisitions (i.e., typically from 8 Mbits to 64 Mbits) are known in the art. Unfortunately, the desirable long record length feature is also the source of a problem. Heretofore, there was no easy way to search through such a long record to locate an anomaly that may be present at some point in the acquired signal. For example, a visual search of a 32 Mbit record displayed at a rate of 500 points per second would take 17 hours. One doubts the ability of even the most patient of oscilloscope operators to maintain his attention for so long a time.

Some modern oscilloscopes are equipped with a printer, contained with its cabinet, for printing oscilloscope traces and data on a roll of paper. One might think that the solution to the above-described problem would be to merely print the long record length waveform out and then examine the paper trace. Unfortunately, calculations reveal that in order to print out even an 8 Mbit record would require a paper printout on the order of several miles long.

SUMMARY OF THE INVENTION

A gate comparator control panel, in accordance with the subject invention, allows a user to define up to four different gate regions that may exist on any live waveforms, maths waveforms, or REF waveforms. A menu for each gate controls the position of each gate and selects the source for the signal that is to be gated. All gates must be the same width. A high level application copies the gated region of a waveform into a REF memory. For example, Gate 1 would go into REF 1, gate 2 into REF2 and so on. A user-settable tolerance value is used to determine if a difference between the waveforms of the gates reaches a point at which a violation is indicated. A master gate position control causes all gates to move by the same amount, thus maintaining a constant distance between them. A master gate width control causes all gates to change width. Run, pause, and stop menu items are used to control how the gates automatically scan though the waveforms to which they are attached, and to maintain constant spacing between them. A comparison is performed on a point-by-point basis between the signals of the gates.

BRIEF DESCRIPTION OF THE DRAWINGS

FIG. 3 is an illustration showing that four gates may be defined on one or more waveforms in accordance with the subject invention.

FIGS. 4A and 4B are illustrations showing the gated regions of FIG. 3 after they have been copied into a reference memory in accordance with the subject invention.

FIG. 5 is an illustration of a gate comparator control screen in accordance with the subject viva invention.

DETAILED DESCRIPTION OF THE EMBODIMENT

The gate comparator to be described preferably is realized in JAVA® application software running on a Windows® operating system of a modern oscilloscope.

Figure 1:
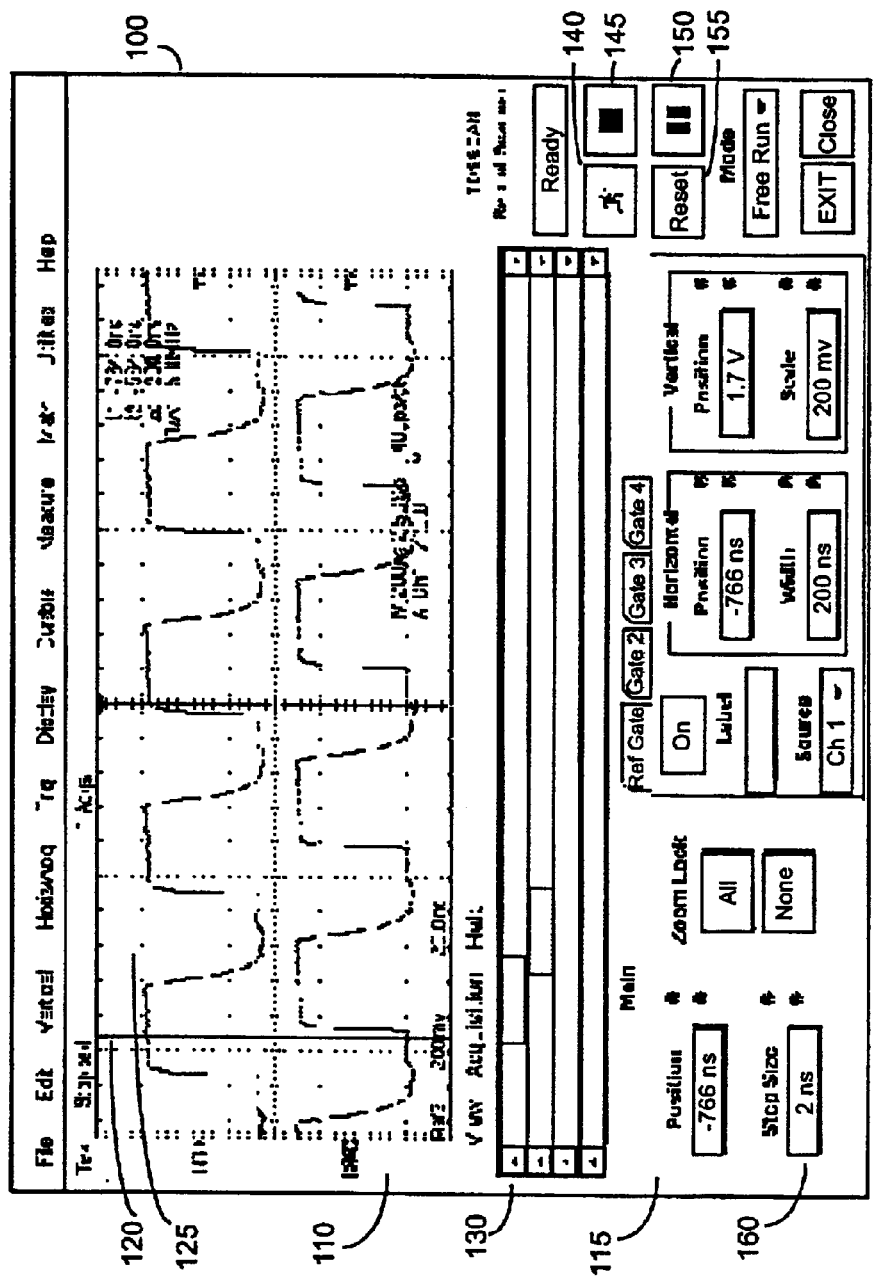
FIG. 1 is an illustration of a screen display showing two reference waveforms and a gate comparator control panel in accordance with the subject invention.

FIG. 1 is an illustration of a screen display 100 showing two reference waveforms in a waveform display area 110, and a gate comparator control panel in a controls area 115. There are four selectable gate controls (i.e., a measurement window controls), Gate 1, Gate 2, Gate 3, and Gate 4. Gate 1 is considered to be a reference gate Ref Gate. The control panel of FIG. 1 is used to set the working parameters for Ref Gate (and other gates Gate 2, Gate 3, Gate 4, if desired). The waveform display of FIG. 1 indicates that two gates are active, Gate 1 and Gate 2 producing reference waveforms R1 and R2, respectively.

This control screen has "soft keys" for Run 140, Stop 145, Pause 150, and Reset 155 functions, for controlling a "roll mode" that works like a standard tape deck control. Speed selection for the roll mode scan is also provided via a control 160 for selecting step size.

"Roll mode" in this context means to move the gates through a stored waveform. Since each gate is sized to fit the display screen width, the waveform will move horizontally on the screen in the same manner as roll mode acquisition displays the data That is, after alignment of the gates on the two waveforms, both gates step through both waveforms in synchronism, doing the comparison on the fly. In this way, the comparison time is reduced from 17 hours to a matter of minutes.

Figure 2:
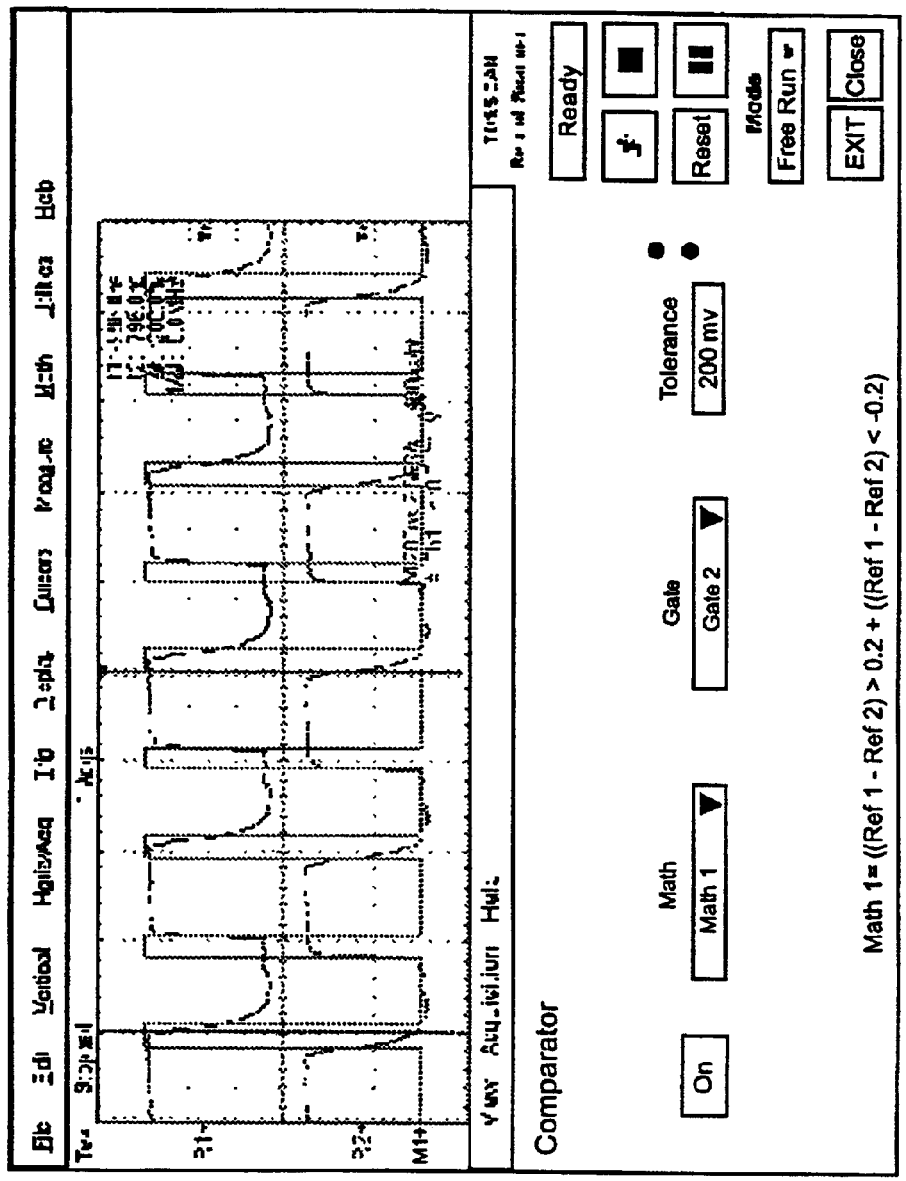
FIG. 2 is an illustration of a screen display showing two active gates and a gate comparator in operation in accordance with the subject invention.

FIG. 2 is an illustration showing the effect of turning-on the gate comparator. FIG. 2 shows the two reference waveforms R1 and R2 and display M1 of the gate comparison regions. When the gate comparator is turned-on, the value of the signal within all other active gates (i.e., other gates that are also turned-on) will be subtracted from the value of the signal within Gate 1 on a point-by-point basis to produce a difference. This scanning process causes all gates to move together along a signal to maintain their constant space between them.

If the difference is greater than a user-settable comparator tolerance value, then a violation has occurred. The user is informed of violations. If a violation occurs while the gates are automatically being scanned, then the scan state will be set to pause and the gate will be positioned such that the point causing the violation will be in the center of the gate. Other indications may be used to show that violations occurred.

With respect to measurements and waveform equations, the gated regions that are stored in REF memories (to be described later) may have measurements applied to them. In addition, they may be used within waveform math expressions. This feature is shown by the equation displayed at the bottom of the screen display of FIG. 2.

FIG. 3 shows that four gated areas may be defined on one or more waveforms. In this case, two gated areas are defined on each waveform. In this example, the defined gated areas Gate 1, Gate 2, Gate 3, and Gate 4, encompass signal anomalies that may be of interest to this particular user. The data within each gated region is copied into a reference memory within the oscilloscope. The user can choose the source waveform for each gate to reside on. Referring back to FIG. 1, note that the user can adjust the horizontal position of the gate on the chosen waveform by means of cursors controlled by slide controls 130, or by other means such as a knob. The user can also adjust the width of the gates via a gate width control.

FIGS. 4A and 4B are illustrations showing the gated regions of FIG. 3 after they have been copied into a reference memory in accordance with the subject invention. Note that only the gated portions of the data are stored in the reference memories. In this way, efficiency of measurements and waveform equations is improved because only the data of interest is included in the measurement or calculations.

It is important to note that the subject invention is suitable for general-purpose use by any operator working with long data records. However, this invention is particularly useful for directly addressing the needs of disk drive test engineers. For example, it is envisioned that a disk drive test engineer would typically store a known good PRML read channel signal into a REF 4 memory slot. Use of REF 1 for this purpose should be avoided because it is going to be used as the reference gate. Since we wish to apply a gate to this known good PRML signal in REF 4 we must turn off Gate 4 because its output normally goes into REF 4. Next, we set the source for Gate 1 to be REF 4. Next, we would set the source of Gate 2 to be channel 1 CH 1, which contains the read channel signal.

Assume that a trigger function has been properly set up and that the same pattern is being read from the disk drive as had been previously stored into REF 4. Note that the user can position Gate 1 on REF 4 and Gate 2 on CH 1 until they are properly aligned for comparison. To automatically compare the two waveforms, the gate comparator is then turned on and the run button is pressed. The user could also just scan through the data to visually compare the waveforms by turning the master position control for all the gates. In addition, the user is able to define measurements for the gated data in Gate 1 and Gate 2.

This gate comparator system when taken as a whole is unique in its organization of gating controls and functionality. Prior oscilloscopes do not have a single entity called a gate comparator as is described herein. Such prior oscilloscopes accomplish a somewhat gating-like feature by defining a waveform equation. That is, the user is allowed to create zoom waveforms. Each one is stored into a waveform equation slot, precluding the use of that slot for a mathematical function. As a result, if four zoom waveforms are defined, they cannot then be used in waveform functions. In contrast, the subject invention can utilize gating functions without tying-up the waveform slots, while preserving the ability to use mathematical functions.

In the prior art oscilloscopes, in order to lock the gates together for scrolling and still maintain the horizontal offset between them that was dialed-in, the user must navigate to yet another menu. The subject application overcomes this difficulty by grouping all required controls on a single gate comparator control panel.

Some prior art oscilloscopes have a feature known as auto scroll. Auto scroll allows a user to cause the entire length of the data records to automatically scroll-by on the screen for a purely visual comparison by the user. The user can also adjust the speed at which the scrolling occurs. As noted above, when this auto scrolling is set to display at a rate of 500 points per second, a visual search of a 32 Mbit (megabit) record would take 17 hours. It is important to note that in the prior art long record length oscilloscopes, there is no automatic means for comparing the zoomed areas of the reference and "live" waveforms, as is described in the subject application. That is, the tolerance and compare features of the subject invention are not present in the prior art long record length oscilloscopes.

Figure 5:
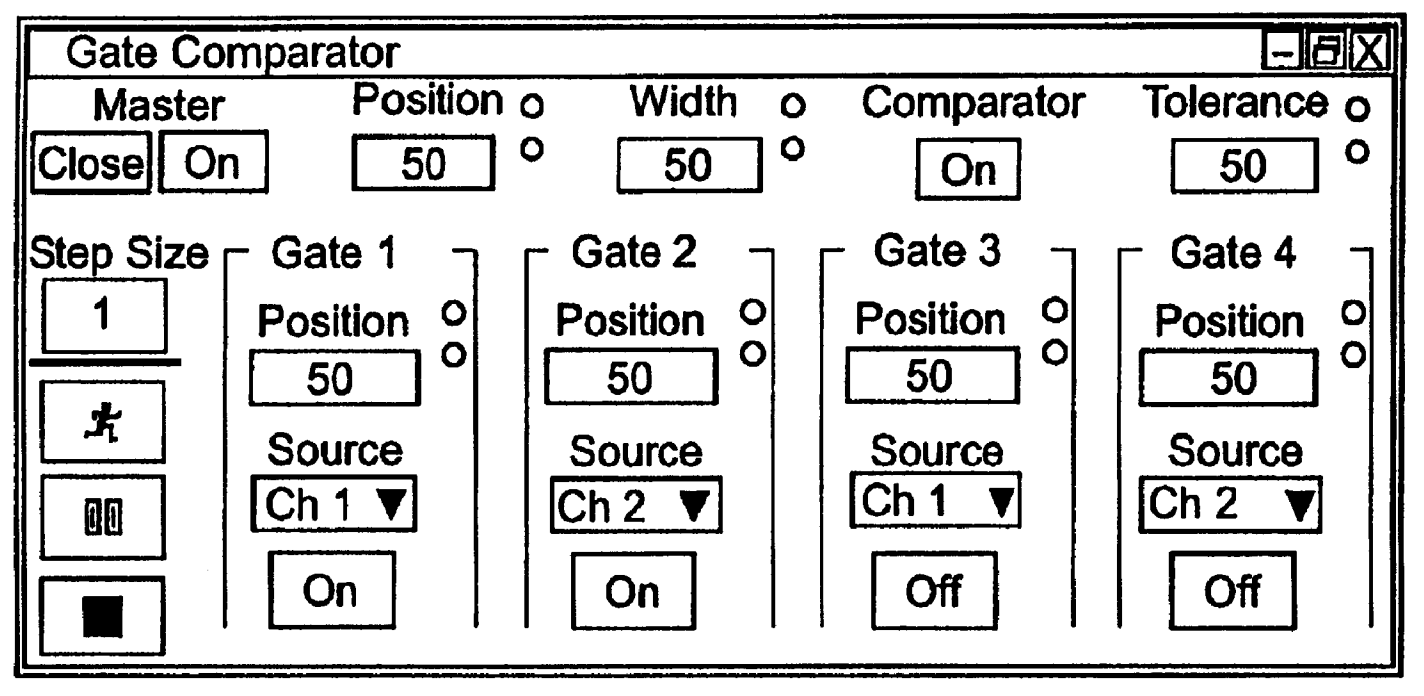

Another gate comparator control screen display is shown in FIG. 5. The features of this control screen are as follows. There is a control menu for each of four gates, Gate 1, Gate 2, Gate 3, and Gate 4. Each gate menu allows a user to choose a source waveform for the gate and a position for the gate on that waveform. In addition, there is an on/off control for each gate. This control screen also has soft keys for Run, Pause and Stop functions, for controlling a "roll mode" that works like a standard tape deck control. Speed selection for the roll mode scan is also provided via a control for selecting step size.

It is envisioned that software trigger menus may form part of the gate comparator. In this way, the roll mode scroll may be set to stop on edges, for example. Other types of software trigger modes, such as runt trigger, can also be incorporated into the gate comparator menu system.

Note the controls placed along the top of the control screen of FIG. 5. These are Master Controls that affect the settings of all of the gates. That is, adjusting the Master gate Position control moves all gates by the same amount while maintaining constant spacing between them. Similarly, the Master width control controls the width of all gates, and a common tolerance can be applied to all gates via the Master Tolerance control.

Figure 6:
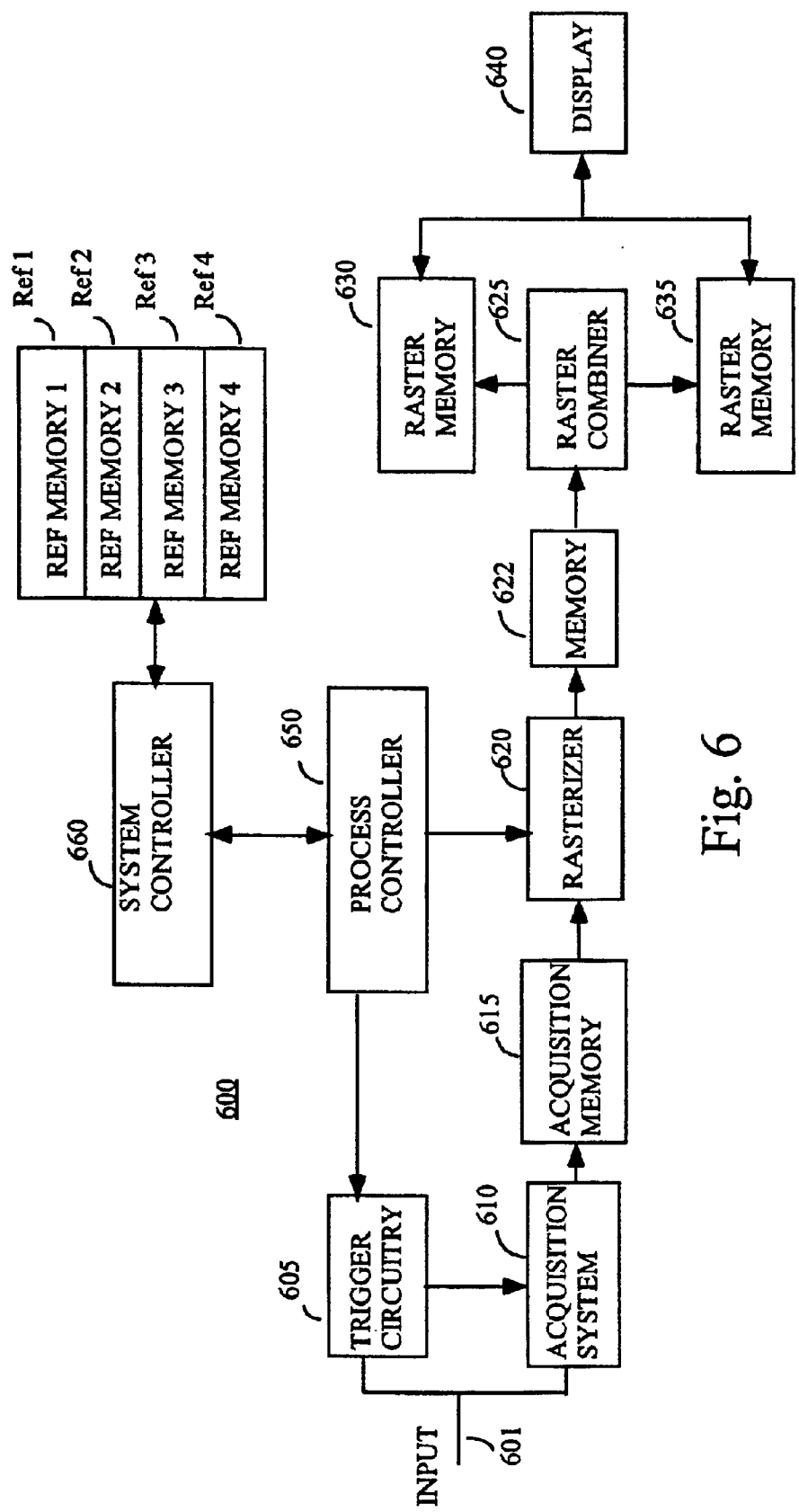
FIG. 6 is a simplified high-level diagram of an oscilloscope suitable for use with the subject invention.

FIG. 6 is a simplified block diagram of a modern digital oscilloscope 600 useful for practicing the subject invention. It includes an input 601 for acquiring a signal from a circuit under test. The "front end" includes Trigger Circuitry 605 for generating trigger signals to be applied to an Acquisition System 610. Acquisition System 610 acquires digital signal samples continuously, and in response to triggers signals, stores them in an Acquisition memory 615. Acquisition memory 615 supplies signal samples to Rasterizer 620 for processing, storage in raster memory 622, and eventual display. A more analog-like display is obtained by means of the arrangement of a Raster Combiner 625 and Raster Memories 630, 635 that permits graceful decay of the displayed signals. The output of this arrangement is displayed on a display screen 640 of the oscilloscope. The oscilloscope operates under control of two controllers, a process controller 650, and a System controller 660. System controller 660 interfaces with the reference memories REF Memory 1 REF 1, REF Memory 2 REF 2, REF Memory 3 REF 3, and REF Memory 4 REF 4.

In operation, the data within a gate is moved to the corresponding REF memory in the oscilloscope on each acquisition update if the gate is on. For example, Gate 1 data is placed in REF 1 and Gate 4 data is placed in REF 4. This then does not waste the math waveform slots available, as is the case of the above-mentioned prior art long record length oscilloscopes. In addition, each REF memory can have a full set of measurements turned on. They may also be used in math waveform expressions.

The REF memory slots are more than just an easy place to store data to be displayed. Because the gate is sized to fit the window, one gets an automatic zoom to the screen width of the waveform content of the REF memory. If the gate is set to a fairly long record length, one may still not be able to easily discern an anomaly in the REF waveform. In such a case, one may set a zoom box on the REF waveform, and in effect, obtain a zoom on a zoom. The REF slots also serve to isolate data for waveform measurements, or waveform math applications. Moreover, the contents of the REF memories may be exported to data files, if desired.

What has been described is a desirable tool for use on all long record length oscilloscopes because it provides, for the first time a tool to easily analyze and deal with the huge amount of data contained in long records.

Although the gate comparator of the subject invention has been described as preferably being realized in JAVA® application software running on a Windows® operating system, the invention is not intended to be so restricted, and is intended to encompass hardware circuitry for performing the comparison functions described herein.

One skilled in the art will recognize that the subject invention is not limited to digital data, and is equally advantageous when used with analog data The term "gate" as used herein is synonymous with the term "window" as applied to a viewing time slot superimposed upon a portion of a waveform.

It is herein recognized that the subject invention is useful in instruments other than an oscilloscope, such as a logic analyzer, or a spectrum analyzer.

What is claimed is:

1. A method of processing a long record length data acquisition in a test and measurement instrument comprising the steps of:

defining a plurality of gates with respect to the long record length data acquisition, each gate encompassing a portion of the long record length data acquisition and one of the gates being a reference gate;

entering a mathematical comparison expression for comparing contents of a plurality of reference memories, one for each gate, to the reference memory associated with the reference gate;

storing the portions of the long record length data acquisition encompassed by the gates in the reference memories;

executing the mathematical comparison expression between the portions of the long record length data acquisition from the reference memories to determine if a violation exists; and scanning the long record length data acquisition by incrementing the positions of the gates in tandem and, for each incremental change in position, repeating the storing and executing steps until all of the long record length data acquisition has been processed.

2. The method as recited in claim 1 wherein the defining step comprises the step of selecting specified ones of the plurality of gates for use.

3. The method as recited in claims 1 or 2 wherein the long record length data acquisition represents a plurality of waveform signals with at least one gate associated with each of the waveform signals.

4. The method as recited in claims 1 or 2 wherein the defining step comprises the steps of:

positioning each gate at a predetermined location along the long record length data acquisition; and designating a width for the gates, the width of all the gates being equal.

5. The method as recited in claim 4 wherein the defining step further comprises the step of selecting a source for each gate.

6. The method as recited in claim 5 wherein the source comprises data selected from the group consisting of the long record length data acquisition, simulated data and reference data.

7. The method as recited in claim 4 wherein the positioning step comprises the step of providing a relative offset in position between the gates to provide alignment between the gates.

8. The method as recited in claim 3 wherein the defining step comprises the steps of:

positioning each gate at a predetermined location of the long record length data acquisition; and designating a width for the gates, the width of all the gates being equal.

9. The method as recited in claim 8 wherein the defining step further comprises the step of selecting a source for each gate.

10. The method as recited in claim 9 wherein the source comprises data selected from the group consisting of the long record length waveform acquisition, simulated data and reference data.

11. The method as recited in claim 8 wherein the positioning step comprises the step of providing a relative offset in position between the gates.

12. The method as recited in claim 1 wherein the scanning step is performed automatically.

13. The method as recited in claim 1 further comprising the steps of:

pausing the scanning step when the violation is indicated by the indicating step; and displaying the portions of the long record length data acquisition from the reference memories.

* * * * *